United States Patent
Sun et al.

(10) Patent No.: US 6,624,073 B2
(45) Date of Patent: Sep. 23, 2003

(54) OPTIMIZED TACN THIN FILM DIFFUSION BARRIER FOR COPPER METALLIZATION

(75) Inventors: Shi-Chung Sun, Hsin-Chu (TW); Hao-Yi Tsai, Hsin-Chu (TW)

(73) Assignees: ProMos Technologies, Inc., Hsin-Chu (TW); Mosel Vitelic Inc., Hsin-Chu (TW); Intineon Technologies, Inc., Munich (DE)

(*) Notice: Subject to any disclaimer, the term of this patent is extended or adjusted under 35 U.S.C. 154(b) by 0 days.

(21) Appl. No.: 09/999,453

(22) Filed: Dec. 3, 2001

(65) Prior Publication Data

US 2002/0182862 A1 Dec. 5, 2002

(30) Foreign Application Priority Data

Apr. 27, 2001 (TW) .......................... 90110146 A

(51) Int. Cl.$^7$ .......................... C23C 14/34; H01L 21/44
(52) U.S. Cl. .......................... 438/687; 438/685; 438/656; 438/648; 204/192.17
(58) Field of Search .......................... 209/192.15, 192.17; 438/648, 656, 685, 687

(56) References Cited

U.S. PATENT DOCUMENTS

| 4,985,750 A | 1/1991 | Hoshino ....................... 357/71 |
| 5,744,394 A | 4/1998 | Iguchi et al. ................ 438/276 |
| 5,973,400 A | 10/1999 | Murakami et al. ........... 257/751 |
| 6,028,359 A | 2/2000 | Merchant et al. ............ 257/750 |
| 6,100,587 A | 8/2000 | Merchant et al. ............ 257/751 |

*Primary Examiner*—Rodney G. McDonald
(74) *Attorney, Agent, or Firm*—George O. Saile; Stephen B. Ackerman; Rosemary L. S. Pike

(57) ABSTRACT

A new method of forming a tantalum carbide nitride diffusion barrier layer having optimized nitrogen concentration for improved thermal stability is described. A contact region is provided in a substrate. A via is opened through an insulating layer to the contact region. A tantalum carbide nitride barrier layer is deposited within the via wherein the tantalum carbide nitride layer has an optimized nitrogen content of between about 17% and 24% by atomic percentage. A layer of copper is deposited overlying the tantalum carbide nitride barrier layer to complete copper metallization in the fabrication of an integrated circuit device.

17 Claims, 6 Drawing Sheets

OPTIMIZED TACN THIN FILM DIFFUSION BARRIER FOR COPPER METALLIZATION

BACKGROUND OF THE INVENTION (1) Field of the Invention

The invention relates to a method of barrier layer formation in the fabrication of integrated circuits, and more particularly, to a method of forming an optimized tantalum carbide nitride barrier layer to prevent copper diffusion in the manufacture of integrated circuits.

(2) Description of the Prior Art

In a common application for integrated circuit fabrication, a contact/via opening is etched through an insulating layer to an underlying conductive area to which electrical contact is to be made. A barrier layer, typically titanium nitride, is formed within the contact/via opening. A conducting layer material, typically tungsten, is deposited within the contact/via opening. As device sizes continue to shrink, these typical materials are no longer adequate. Because of its lower bulk resistivity, Copper (Cu) metallization is the future technology for feature sizes of 0.18 microns and below. Cu metallization requires a robust diffusion barrier to prevent the copper from diffusing through the active junctions.

U.S. Pat. No. 5,744,394 to Iguchi et al discloses a barrier layer that may comprise TaN, TaC, or TaNC. U.S. Pat. No. 5,973,400 to Murakami et al discloses a barrier layer comprising TaC or TaNC. While these two patents disclose a TaNC barrier layer, they do not specify the optimal nitrogen concentration within the film which will maximize simultaneously the barrier properties and low electrical resistivity. U.S. Pat. No. 4,985,750 to Hoshino shows a Ta or TaN barrier layer. U.S. Pat. Nos. 6,100,587 to Merchant et al and 6,028,359 to Merchant et al teach barrier layers of TaC, TaN, or TaB.

SUMMARY OF THE INVENTION

A principal object of the present invention is to provide an effective and very manufacturable method of forming a robust barrier layer in a copper metallization process in the fabrication of integrated circuit devices.

Another object of the invention is to provide a method for forming a tantalum carbide nitride barrier layer that will prevent copper diffusion in the fabrication of integrated circuit devices.

A further object of the invention is to provide a method for forming a tantalum carbide nitride diffusion barrier layer having optimized nitrogen concentration for improved thermal stability.

In accordance with the objects of this invention a new method of forming a tantalum carbide nitride diffusion barrier layer having optimized nitrogen concentration for improved thermal stability is achieved. A contact region is provided in a substrate. A via is opened through an insulating layer to the contact region. A tantalum carbide nitride barrier layer is deposited within the via wherein the tantalum carbide nitride layer has an optimized nitrogen content of between about 17% and 24% atomic percentage. A layer of copper is deposited overlying the tantalum carbide nitride barrier layer to complete copper metallization in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
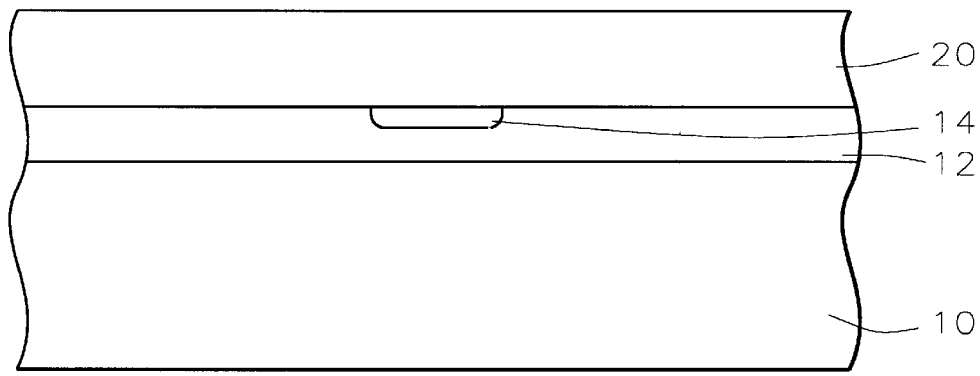
FIGS. 1 through 4 schematically illustrate in cross-sectional representation a preferred embodiment of the present invention.

Referring now more particularly to FIG. 1, there is illustrated a portion of a partially completed integrated circuit device. There is shown a semiconductor substrate 10, preferably composed of monocrystalline silicon. Semiconductor devices structures may be formed in and on the semiconductor substrate and covered with an insulating layer. The semiconductor device structures and the insulating layer thereover are represented by layer 12 in FIG. 1. 14 is a region to be contacted by the copper metallization process of the present invention. For example, 14 may be a source/drain region or a gate electrode, or a first level of metallization. A single damascene process will be illustrated in the drawings. It should be understood by those skilled in the art that the invention is not limited to the embodiment illustrated in the drawing figures, but is applicable to any application in which copper metallization is used.

An insulating layer 20, composed of silicon dioxide, borophosphosilicate glass (BPSG), borosilicate glass (BSG), phosphosilicate glass (PSG), or the like, is deposited over the surface of the substrate to a thickness of between about 5000 to 9000 Angstroms and preferably planarized.

Figure 2:
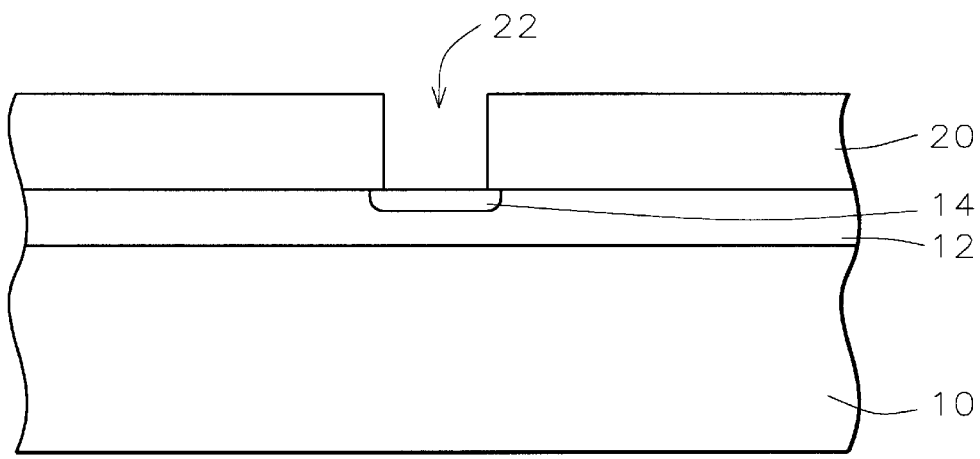

A contact/via opening or a damascene opening 22 is etched through the insulating layer 20 to contact region 14, as shown in FIG. 2. Copper can diffuse into the insulating layer adjacent to the contact opening. Therefore, a diffusion barrier layer must be deposited within the opening 22 before it is filled with copper. The diffusion barrier layer must be able to prevent copper diffusion especially at increased temperatures. Thus, the thermal stability of the diffusion barrier is critical. The inventors have found that the thermal stability of a tantalum carbide nitride layer with an optimized nitrogen concentration is superior to the thermal stability of a TaCN layer with excessive nitrogen content or TaC (without nitrogen doping).

Figure 3:
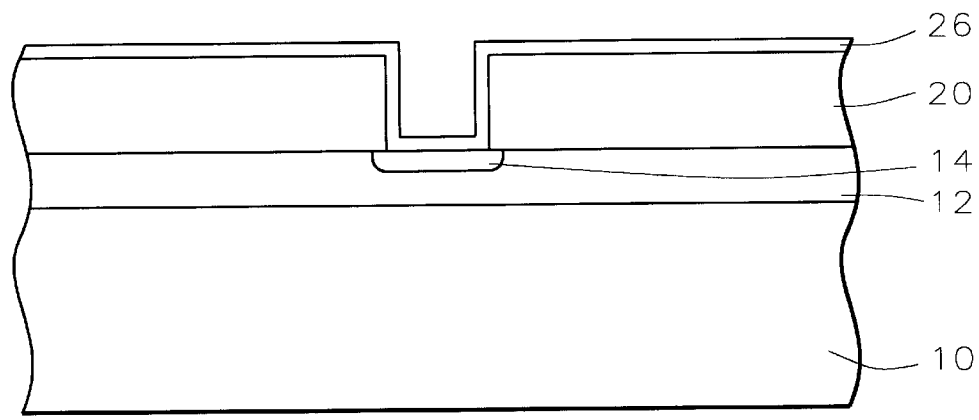

Referring now to FIG. 3, a tantalum carbide nitride diffusion barrier layer 26 is deposited over the insulating layer and within the opening 22. The TaCN layer is sputter deposited to a thickness of between about 5 and 100 nanometers. Nitrogen is added to TaC during sputtering. The sputtering process comprises reactive sputtering of a TaC target in a gas mixture of Ar and nitrogen. The $N_2$/Ar flow ratio varies from 0/24 to 6/24 sccm. Pressure is maintained at between about 5 and 10 mtorr, and preferably about 7.6 mtorr. Prior to deposition, the sputtering system is evacuated to a base pressure of about $5 \times 10^{-7}$ torr or below. The inventors have discovered that a nitrogen concentration optimized to be in the range of 17% to 24% atomic percentage provides the robust copper diffusion barrier of the present invention. A nitrogen to Argon flow rate ratio of (1.5–2.5):24 provides this optimized nitrogen concentration. Most preferably, a $N_2$ to Ar flow ratio of 2:24, which is equivalent to a 22% atomic percentage nitrogen concentration, provides the optimal diffusion barrier layer.

Table 1 illustrates the experimental results of optimizing the nitrogen content of a TaCN barrier layer. $N_2$ to Ar flow ratios and the resulting nitrogen concentration (atomic percentage) are shown. For each concentration, the resistivity was measured in micro-ohms per centimeter. The failure temperature was also measured in degrees Celsius. The failure temperature is defined as the thermal annealing temperature that renders all annealed Cu/barrier/p$^+$n diodes with leakage currents higher than $1 \times 10^{-7}$ Angstroms/cm$^2$.

TABLE 1

| N$_2$/Ar (sccm) | 0/24 | 1.5/24 | 2/24 | 2.5/24 | 4/24 | 6/24 |
|---|---|---|---|---|---|---|
| Nitrogen conc. | 0 | 17 | 22 | 24 | 28 | 32 |
| Resistivity | 385 | 456 | 564 | 720 | 2052 | 5580 |
| Failure Temp. | 550 | 600 | 650 | 600 | 600 | 550 |

The Table shows that the maximum stable temperature occurs for the barrier layer having 22% nitrogen atomic percentage.

Figure 5A:
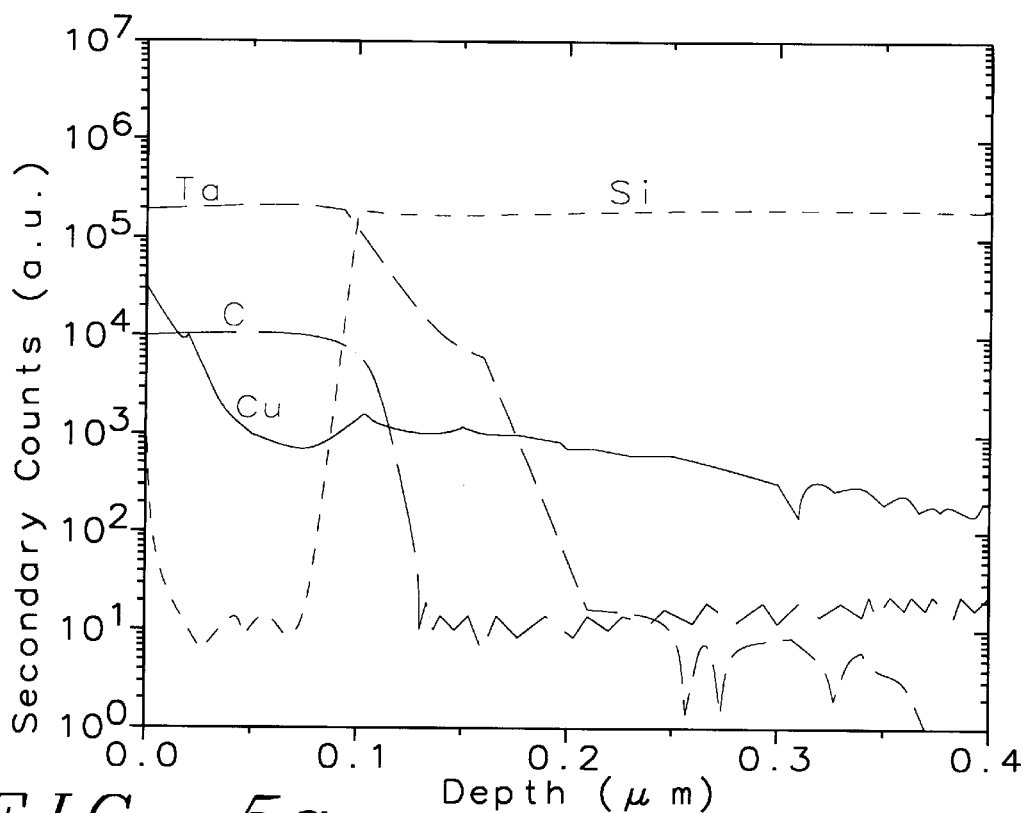
FIGS. 5a through 5f graphically illustrate SIMS depth profiles of various barrier layer structures.
Figure 5B:
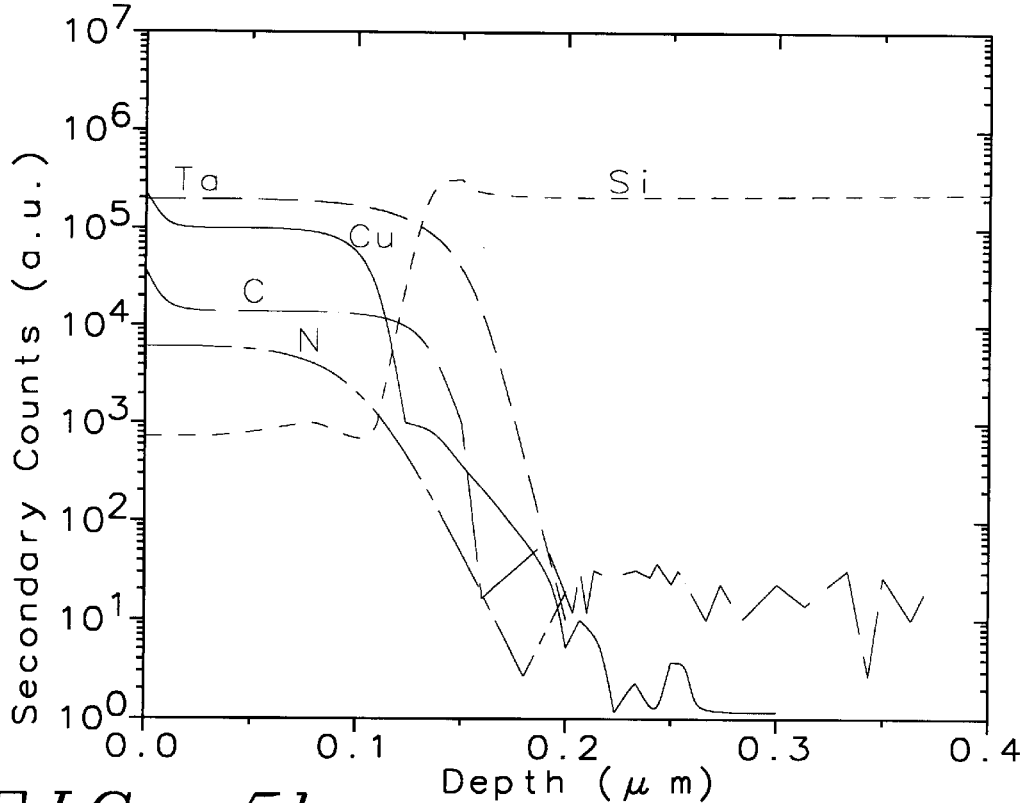
Figure 5C:
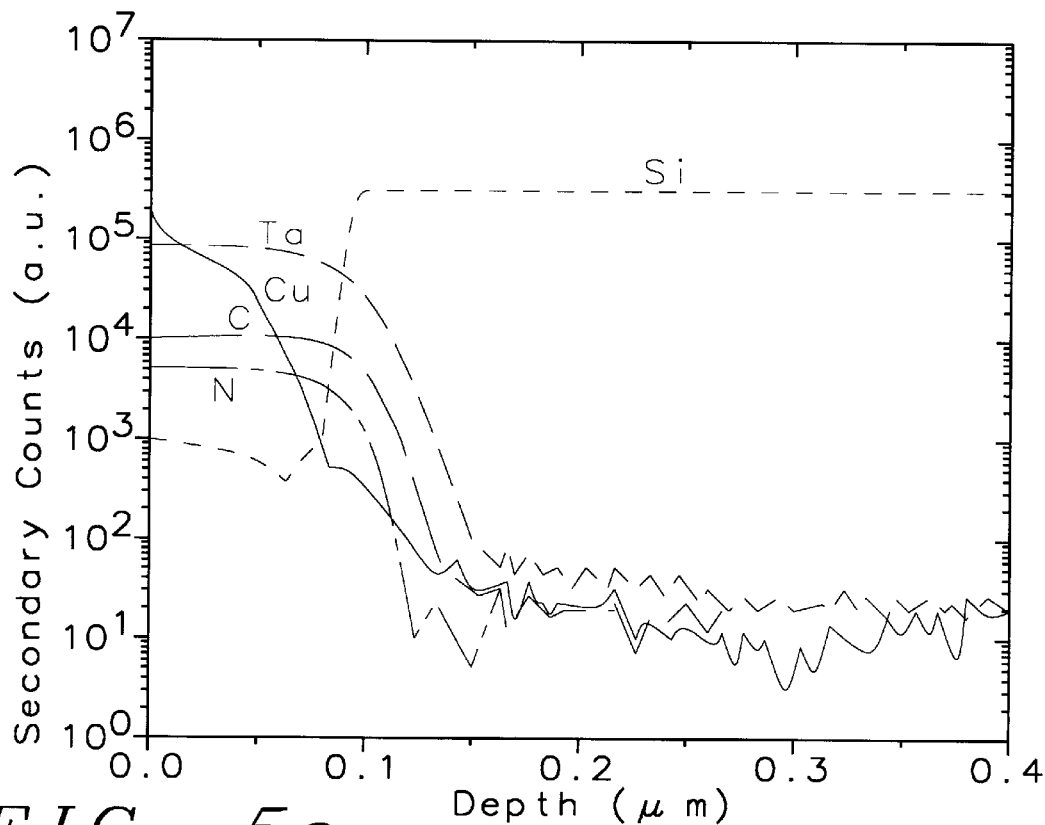
Figure 5D:
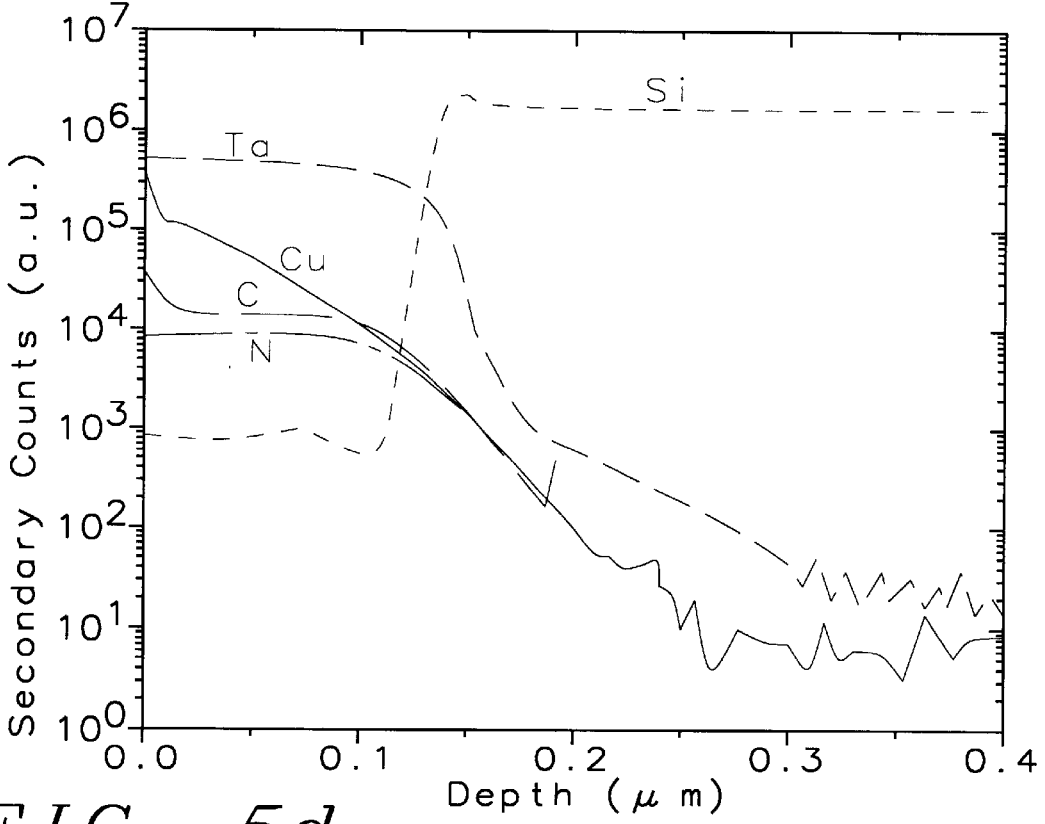
Figure 5E:
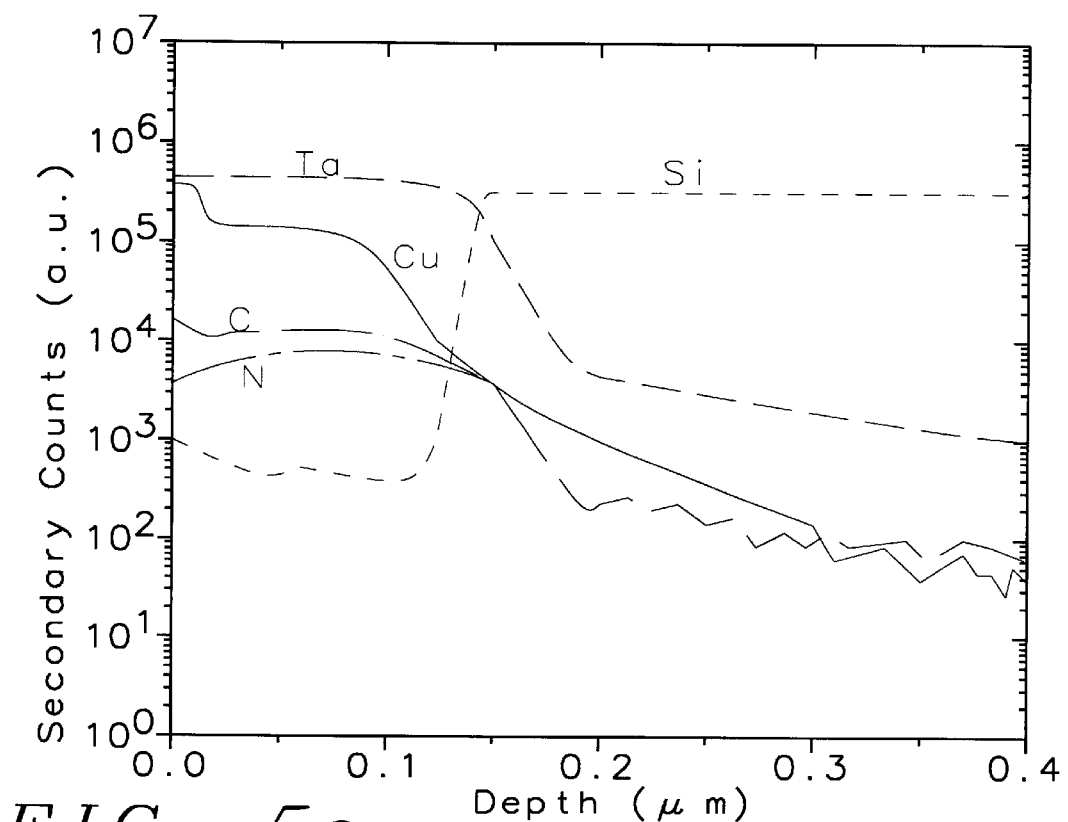
Figure 5F:
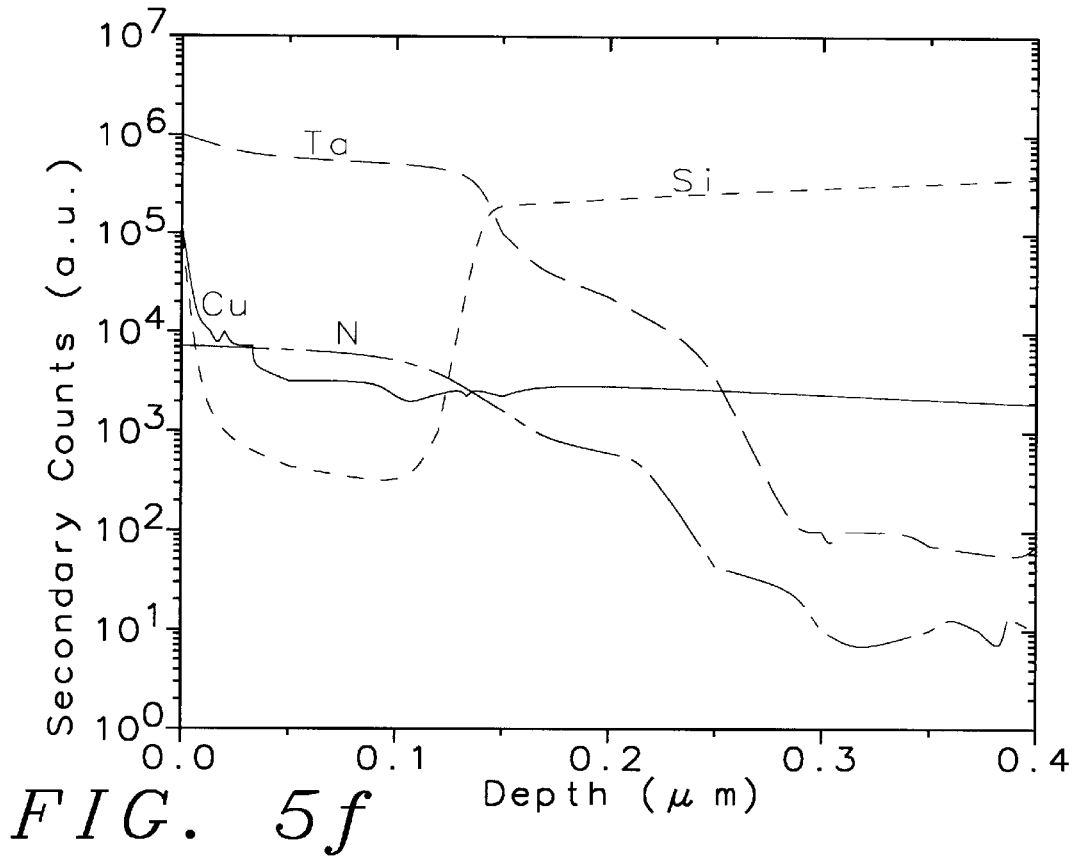

FIGS. 5a through 5f show SIMS depth profiles of annealed Cu/barrier/Si structures. The structures were annealed at 650° C. FIG. 5a shows a barrier layer of TaC and FIG. 5f shows a barrier layer of TaN. It can be seen in these two figures that the copper has penetrated the TaC and TaN barrier layers. FIGS. 5b through 5e show TaCN barrier layers formed by varying the N$_2$ to Ar flow ratio in the range of 1.5/24 to 2.5/24. It can be seen in these four figures that the copper does not penetrate the TaCN barrier.

Figure 6:
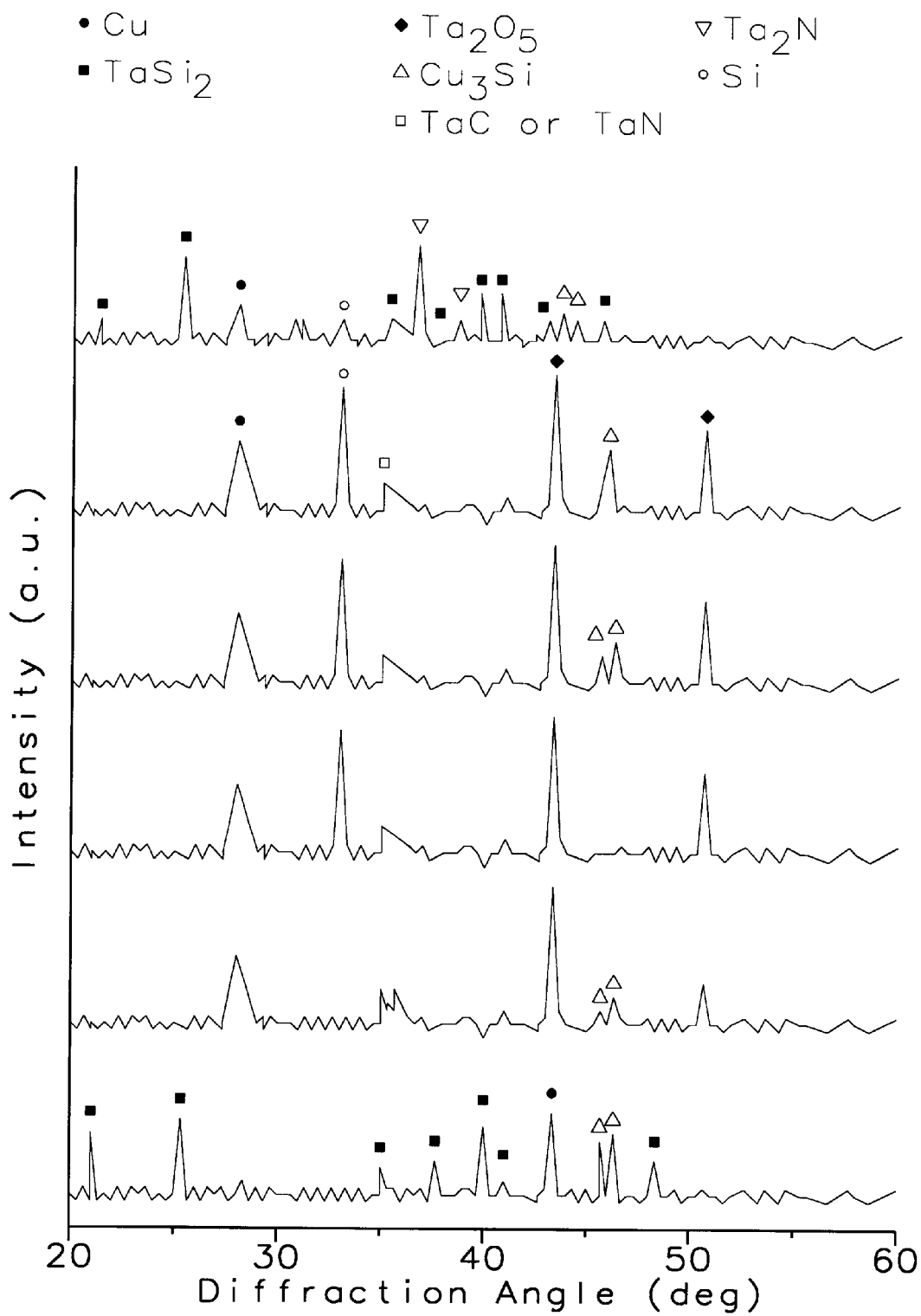
FIG. 6 graphically illustrates X-ray diffraction patterns of various barrier layer structures.

FIG. 6 is an X-ray difraction graph of Cu/TaCN/Si structures after 850° C. annealing in N$_2$ for 30 minutes. The barrier thickness is 60 nm. The TaCN sample (2/24) has the best barrier property. All other samples show the signal of copper silicide peaks (Cu$_3$Si), an indication that copper has penetrated through the barrier and reacted with the silicon.

Figure 4:
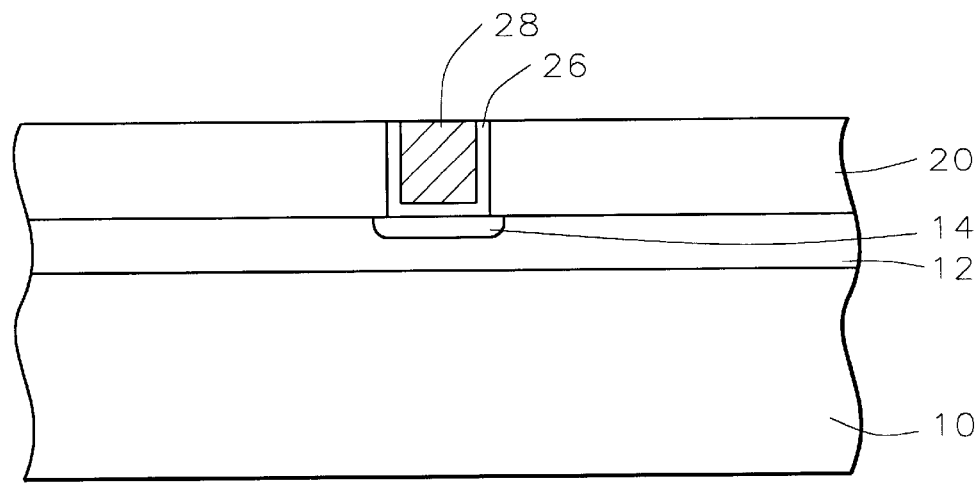

Referring now to FIG. 4, a layer of copper 28 is sputter deposited over the barrier layer to fill the contact/via opening. Or, a copper seed layer is deposited by physical or chemical vapor deposition followed by electro-chemical deposition of copper to fill a deep via hole. Copper diffusion into the dielectric layer 20 is prevented by the improved TaCN diffusion barrier layer of the present invention.

The copper layer and the barrier layer are patterned to form the desired electrical contact. Processing continues as is conventional in the art to complete fabrication of the integrated circuit. The process of the present invention can be used at any level of metallization.

The process of the invention results in an effective and very manufacturable tantalum carbide nitride diffusion barrier for copper metallization. The optimized nitrogen concentration of the TaCN barrier layer of the present invention provides maximum thermal stability.

While the invention has been particularly shown and described with reference to the preferred embodiments thereof, it will be understood by those skilled in the art that various changes in form and details may be made without departing from the spirit and scope of the invention.

What is claimed is:

1. A method of copper metallization in the fabrication of an intergrated circuit device comprising:

providing a contact region in a substrate;

opening a via through an insulating later to said contact region;

depositing a tantalum carbide nitride barrier layer within said via wherein said tantalum carbide nitride layer has an optimized nitrogen contact between 17% and 24% atomic percentage of nitrogen; and depositing a layer of copper overlying said tantalum carbide nitride barrier layer to complete said copper metallization in the fabrication of said integrated circuit device.

2. The method according to claim 1 wherein said step of depositing said tantalum carbide nitride barrier layer comprises reactive sputter depositing of a tantalum carbide target in a gas mixture of argon and nitrogen.

3. The method according to claim 1 wherein said step of depositing said tantalum carbide nitride barrier layer comprises sputter depositing tantalum carbide nitride with a nitrogen:Argon flow ratio of (1.5–2.5):24.

4. The method according to claim 1 wherein said step of depositing said tantalum carbide nitride barrier layer comprises sputter depositing tantalum carbide nitride with a nitrogen:Argon flow ratio of 2:24.

5. The method according to claim 1 wherein said tantalum carbide nitride barrier layer prevents copper diffusion into said insulating layer.

6. The method according to claim 1 wherein said tantalum carbide nitride barrier layer has thermal stability up to 650 to 850° C.

7. A method of copper metallization in the fabrication of an integrated circuit device comprising:

providing a contact region in a substrate;

opening a via through an insulating layer to said contact region;

depositing a tantalum carbide nitride barrier layer within said via wherein said tantalum carbide nitride layer has an optimized nitrogen content of between 17% and 24% atomic percentage of nitrogen; and depositing a layer of copper overlying said tantalum carbide nitride barrier layer wherein said tantalum carbide nitride barrier layer prevents copper diffusion into said insulating layer to complete said copper metallization in the fabrication of said integrated device.

8. The method according to claim 7 wherein said step of depositing said tantalum carbide nitride barrier layer comprises reactive sputter depositing of a tantalum carbide target in a gas mixture of argon and nitrogen.

9. The method according to claim 7 wherein said step of depositing said tantalum carbide nitride barrier layer comprises sputter depositing tantalum carbide nitride with a nitrogen:Argon flow ratio of (1.5–2.5):24.

10. The method according to claim 7 wherein said step of depositing said tantalum carbide nitride barrier layer comprises sputter depositing tantalum carbide nitride with a nitrogen:Argon flow ratio of 2:24.

11. The method according to claim 7 wherein said tantalum carbide nitride barrier layer has thermal stability up to 650 to 850° C.

12. A method of copper metallization in the fabrication of an integrated circuit device comprising:

providing a contact region in a substrate;

opening a via through an insulating layer to said contact region;

depositing a tantalum carbide nitride barrier layer within said via wherein said tantalum carbide nitride layer has an optimized nitrogen content of 22% atomic percentage; and depositing a layer of copper overlying said tantalum carbide nitride barrier layer wherein said tantalum carbide nitride barrier layer prevents copper diffusion into said insulating layer to complete said copper metallization in the fabrication of said integrated circuit device.

13. The method according to claim 12 wherein said step of depositing said tantalum carbide nitride barrier layer comprises reactive sputter depositing of a tantalum carbide target in a gas mixture of argon and nitrogen.

14. The method according to claim 12 wherein said step of depositing said tantalum carbide nitride barrier layer comprises sputter depositing tantalum carbide nitride with a nitrogen:Argon flow ratio of (1.5–2.5):24.

15. The method according to claim 12 wherein said step of depositing said tantalum carbide nitride barrier layer comprises sputter depositing tantalum carbide nitride with a nitrogen:Argon flow ratio of 2:24.

16. The method according to claim 12 wherein said step of depositing said tantalum carbide nitride barrier layer comprises sputter depositing tantalum carbide nitride with a nitrogen:Argon flow ratio of (1.5–2.5):24 at a pressure of about 7.6 mtorr.

17. The method according to claim 12 wherein said tantalum carbide nitride barrier layer has thermal stability up to 650 to 850° C.

* * * * *

UNITED STATES PATENT AND TRADEMARK OFFICE
CERTIFICATE OF CORRECTION

PATENT NO. : 6,624,073 B2  Page 1 of 1
APPLICATION NO. : 09/999453
DATED : September 23, 2003
INVENTOR(S) : Shi-Chung Sun and Hao-Yi Tsai It is certified that error appears in the above-identified patent and that said Letters Patent is hereby corrected as shown below:

On the Title page, in item (73), delete "Intineon Technologies, Inc., Munich (DE)", and replace with --Infineon Technologies, Inc., Munich (DE)--.

Signed and Sealed this

Twenty-fourth Day of October, 2006

JON W. DUDAS
*Director of the United States Patent and Trademark Office*